United States Patent [19]
Lott

[11] Patent Number: 5,422,595
[45] Date of Patent: Jun. 6, 1995

[54] MINIATURE, LOW COST POWER AMPLIFIER MONITOR

[75] Inventor: Joel M. Lott, Perkasie, Pa.

[73] Assignee: SGS-Thomson Microelectronics, Inc., Carrollton, Tex.

[21] Appl. No.: 157,614

[22] Filed: Nov. 24, 1993

[51] Int. Cl.[6] .......................................... G01R 21/00
[52] U.S. Cl. ........................................ 330/2; 330/295; 330/124 R
[58] Field of Search ..................... 330/2, 295, 124 R

[56] References Cited

U.S. PATENT DOCUMENTS

| | | | |
|---|---|---|---|
| 3,711,782 | 1/1973 | Perrero et al. | 330/295 |
| 5,117,202 | 5/1992 | Tsuruoka | 330/2 |
| 5,314,458 | 5/1994 | Najafi et al. | 607/116 |

Primary Examiner—William L. Sikes
Assistant Examiner—James A. Dudek
Attorney, Agent, or Firm—Renee M. Larson; Lisa K. Jorgenson; Richard K. Robinson

[57] ABSTRACT

According to the present invention, a power amplifier with a plurality of power transistors has detection circuitry corresponding to each power transistor which detects the output power of the power transistors and allows this output power to be monitored and modified if desired. The detection circuitry generates a voltage output signal indicative of the rise and fall times achieved by the power transistor. The voltage output signal of the detection circuitry may be monitored by connecting the voltage output signal to a measuring device, such as an oscilloscope of built-in-test-equipment (BITE). Additionally, the voltage output signal of the detection circuitry may be modified by tuning input matching circuitry and/or output matching circuitry accordingly.

19 Claims, 2 Drawing Sheets

MINIATURE, LOW COST POWER AMPLIFIER MONITOR

BACKGROUND OF THE INVENTION

1. Field of the Invention

The present invention relates generally to power amplifiers having power transistors, and more specifically to a structure for monitoring the power output of individual power transistors of a solid state power amplifier.

2. Description of the Prior Art

Solid state power amplifiers often contain a number of power transistors and the power output of a power amplifier is dependent to some extent on the integrity of individual power transistors in the power amplifier. In a power amplifier having N transistors, it can be difficult to tune individual power transistors to achieve best performance, because the power output of each power transistor, which contributes to the power output of the power amplifier, may not be easily measured.

The effect on the power output of the power amplifier will vary with the number and value of power transistors used. The fewer power transistors a power amplifier has, the more effect one failing transistor will have on the overall power output of the power amplifier. For instance, a power amplifier having only four power transistors may experience a significant power loss if one of the four power transistors fails. On the other hand, a power amplifier having a large number of power transistors may experience little or no effect on the power output of the power amplifier if a single power transistor fails.

Additionally, the envelope of an RF/microwave carrier signal presented to the power amplifier may be degraded at the output of the entire power amplifier if each power transistor does not achieve optimum rise and fall times. This consideration is especially valid for an RF/microwave carrier subjected to rapid amplitude changes, as is often the case in pulse modulated RF/microwave carriers. Thus, there is a current need in the art to be able to quickly tune the matching circuits of the power transistors of a power amplifier in order to obtain the optimum rise and fall times from each power transistor.

In addition to difficulty in measuring the power output of power transistors in a power amplifier, possible reflection problems exist when the impedance of a power transistor is inadequately tuned to the impedance of its source and its load. The benefits of a correct match include minimizing power reflected back into the power transistor source and minimizing power dissipation or loss between the power transistor and its load, as well as maintaining a low power transistor junction temperature. For these reasons, it is desirable to be able to tune the impedance of the input matching circuit and output matching circuit of a power transistor upon being placed into a power amplifier and then, again, during operation as necessary, such that a good conjugate match is established and maintained throughout operation.

Tuning the input and output matching circuits of a power transistor enables a good impedance match between the power transistor and its load to be achieved and maintained so that power transfer is maximized. Additionally, quickly tuning the amplitude of the power transistors will help ensure the best possible rise and fall time for each power transistor; thus, the output signal of the entire power amplifier will be correspondingly improved.

Power amplifier circuitry which makes it possible to measure critical parameters of power transistors does exist in the prior art. However, these solutions tend to be discrete and thus costly. Presently there is not a convenient way to directly determine parameters such as rise and fall times and impedance matching in a time and cost efficient manner. Thus, there is a current need in the art to be able to monitor and modify the output signals of power transistors in a direct way.

SUMMARY OF THE INVENTION

It is therefore an object of the present invention to tune the input and output matching circuits of power transistors of a power amplifier in order to minimize power reflected back into the source of the power transistor and to maximize power transfer between a power transistor and its load.

It is therefore further an object of the present invention to tune the input and output matching circuits of the power transistors of a power amplifier in response to rapid amplitude changes of an RF/microwave carrier signal presented to the power amplifier so that optimum rise and fall times for each power transistor may be achieved and the integrity of the RF/microwave carrier will be preserved at the output of the power amplifier.

Therefore, according to the present invention, a power amplifier with a plurality of power transistors has detection circuitry corresponding to each power transistor which detects the output power of the power transistors and allows this output power to be monitored and modified if desired. The detection circuitry generates a voltage output signal indicative of the rise and fall times achieved by the power transistor. The voltage output signal of the detection circuitry may be monitored by connecting the voltage output signal to a measuring device, such as an oscilloscope or built-in-test-equipment (BITE). Additionally, the voltage output signal of the detection circuitry may be modified by tuning input matching circuitry and/or output matching circuitry accordingly.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

DESCRIPTION OF THE INVENTION

Figure 1:
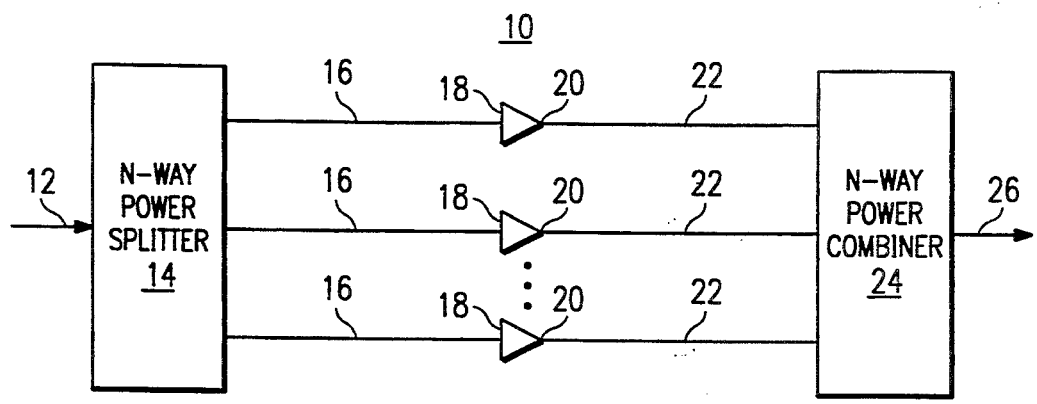
FIG. 1 is a block diagram of a solid state power amplifier having power transistors, according to the prior art.

In a prior art power amplifier having N power transistors, it may be difficult to tune the input and output matching circuits of individual power transistors for best performance, because it is not easy to measure and monitor the power output each power transistor is contributing towards the power output of the power amplifier. Referring to FIG. 1, a block diagram of a solid state power amplifier 10 having N power transistors 18, according to the prior art, is shown. An RF/microwave carrier signal 12 is presented to N-Way Power Splitter 14 which splits RF/microwave carrier signal 12 into N transistor power signals 16 which are fed into N power transistors 18. The power transistors 18 generate N transistor output signals 20 on N 50 Ohm transmission lines 22 which are input signals to N-Way Power Combiner 24. N-Way Power Combiner 24 generates power amplifier output signal 26.

An evident shortcoming of the prior art power amplifier circuitry shown in FIG. 1 is that no structure has been provided to measure the power output of each individual power transistor 18. Thus, it is not easy to determine when and if an individual power transistor 18 has failed or is not providing the power output rise and fall times desired. Also, the matching circuits of individual power transistors 18 are not easily tuned to ensure that these parameters are met.

Figure 2:
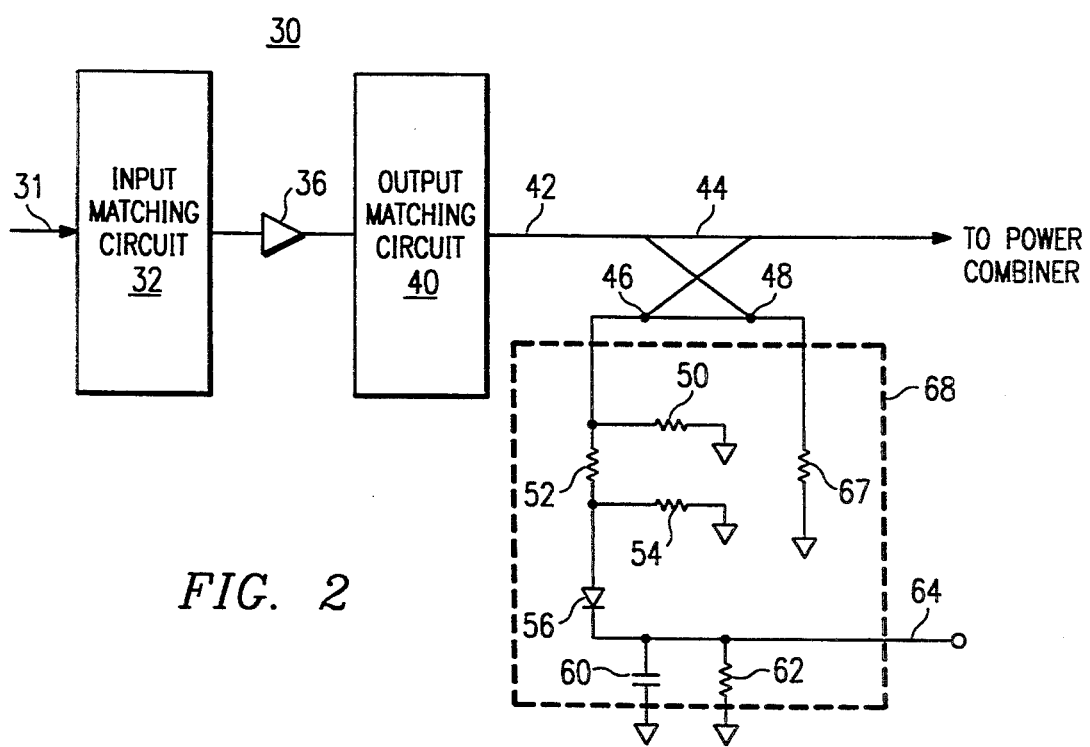
FIG. 2 is a circuit diagram of detection circuitry, according to the present invention.

Referring to FIG. 2, a block diagram of circuitry 30 which detects the power output of a power amplifier power transistor, according to the present invention, is shown. Every power transistor in the power amplifier has circuitry 30 which operates as follows. RF/microwave carrier signal 31 is output from a power splitter analogous to power splitter 14 of FIG. 1 and is presented to input matching circuit 32. RF/microwave carrier signal 31 propagates through input matching circuit 32, power transistor 36, and output matching circuit 40. Power transistor 36 is a common base power transistor; a common emitter power transistor may also be used. 50 Ohm transmission line 42 connects output matching circuit 40 to coupler 44 which has port 46 and port 48. Detection circuitry 68 is defined by the dashed line and comprises resistors 50, 52, and 54, detector diode 56, capacitor 60, resistor 62, and resistor 67. Resistors 50, 52, and 54 perform an attenuator function and, while not essential to the present invention, operate to minimize reflections between coupler 44 and detector diode 56. Detection circuitry 68 generates detection circuitry output voltage 64, which is detected from the sample of the RF/microwave carrier signal provided by coupler 44. Additionally, port 48 of coupler 44 is an isolated port which is connected to 50 Ohm resistor 67 which is used to terminate port 48 of the coupler.

The coupler 44 shown in FIG. 2 is a micro-strip coupler; other couplers such as strip-line and branchline couplers may also be used. Coupler 44 takes a sample of the power output signal of the power transistor 36 on transmission line 42. The output of port 46 is proportional to the power transistor output power flowing in the forward direction towards the output load of power transistor 36. The output load will typically be a power combiner of the type shown in FIG. 1. Detector diode 56 and capacitor 60 rectify the RF/microwave carrier signal of the power transistor output power. Capacitor 60 is charged to the voltage corresponding to the envelope of the RF/microwave carrier, less one diode voltage drop across detector diode 56.

Capacitor 60 has a value of approximately 10 pF and resistor 62 a value of approximately 1K Ohm such that detection circuitry 68 is capable of responding to rapid changes in the amplitude of RF/microwave carrier signal 31; this ability to adapt to changes in the amplitude of the RF/microwave carrier is especially important for pulse modulation where the power output signal of power transistor 36 would be a RF/microwave carrier amplitude modulated with a rectangular pulse, such that detection circuitry output voltage 64 is a video pulse signal. In addition to pulse modulation, RF/microwave carrier signal 31 may also be a continuous signal. In this case, the power output signal of power transistor 36 would not be pulsed, and the voltage level of the power output signal should be representative of continuous RF/microwave carrier signal 31. Detection circuitry output voltage 64 is proportional to the power output of power transistor 36 which will be fed to the power combiner.

Thus, the power output of each power transistor 36 may be detected as detection circuitry output voltage 64. Detection circuitry output voltage 64 may be monitored using an oscilloscope or built-in-test equipment (BITE) in order to detect the failure of power transistor 36. If no signal is detected by detection circuitry 68, then power transistor 36 has failed. Thus, by monitoring detection circuitry output voltage 64, it is easy to diagnose and replace a failed power transistor. In addition to indicating the failure of power transistor 36, monitoring voltage output terminal 64 provides other important information as well. Detection circuitry output voltage 64 is indicative of the rise and fall times achieved by power transistor 36. Additionally, monitoring detection circuitry output voltage 64 indicates whether there is a good conjugate match between power transistor 36 and the output load represented by the power combiner. If the rise and fall times measured at detection circuitry output voltage 64 are not optimum, they may be adjusted by tuning the input matching circuit 32 and/or the output matching circuit 40.

Figure 3:
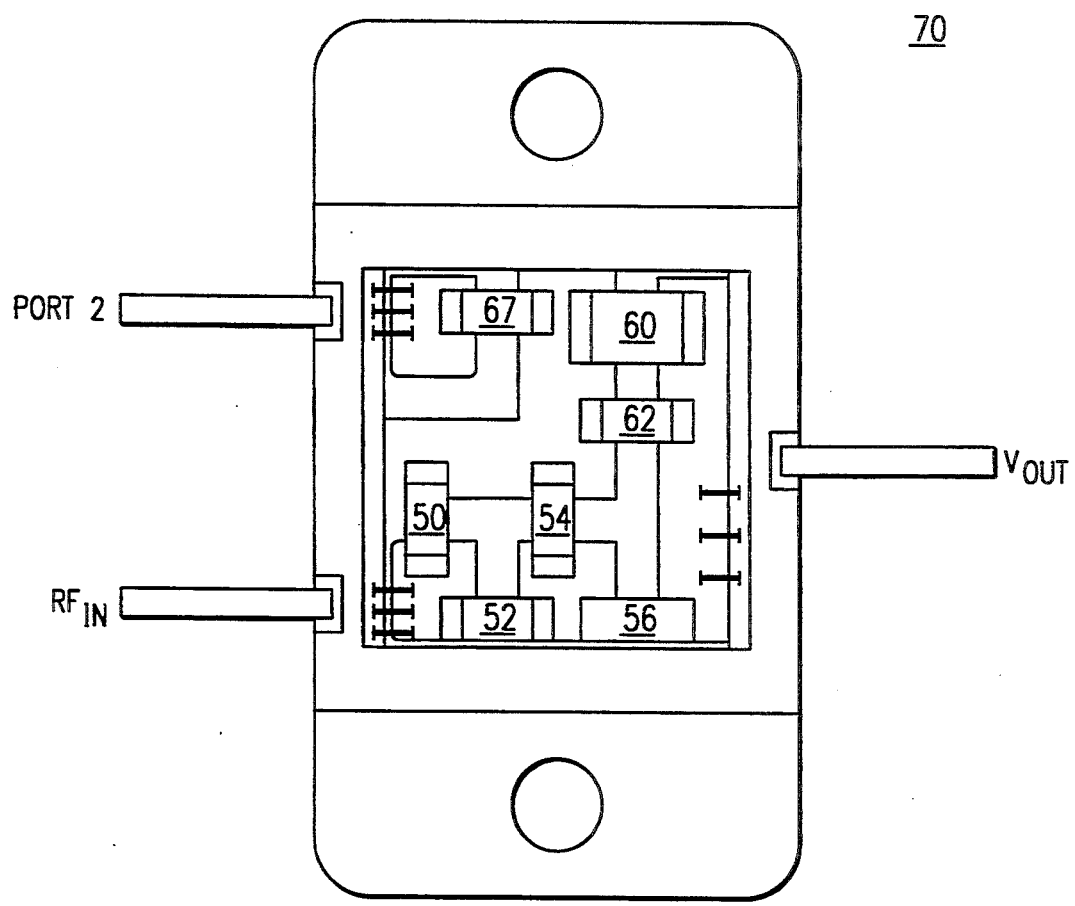
FIG. 3 is a hermetic package used to house the detection circuitry of FIG. 2, according to the present invention.

The components of detection circuitry 68 may be packaged in a small, hermetic electronics package (ceramic pill or metal can) to withstand environmental conditions imposed on the power amplifier. Such a hermetic package 70 is shown in FIG. 3, where the detection circuitry components shown in package 70 are identical to those of FIG. 2. The two inputs to package 70 are the RF/microwave carrier signal $RF_{IN}$ and Port 2, which is analogous to the second port 48 of coupler 44. Voltage output $V_{OUT}$ corresponds to voltage output signal 64 of FIG. 2. Coupler 44 is easily etched onto the output circuit board of the power amplifier at very little additional cost.

Hermetic package 70 provides an important advantage over prior art power amplifier circuitry. While power amplifier detection circuitry is well known in the art, it is novel and useful to place the components of power detection circuitry together, as a component, in a hermetic package. By measuring voltage output $V_{OUT}$ directly with an oscilloscope or BITE, power transistor parameters may be monitored in a cost effective manner. Thus, the rise and fall times of the power transistor may be changed accordingly by simply tuning the matching circuits of the power transistor. This is an advantageous feature, especially in systems which use pulsed modulation, such as radar systems. Also, monitoring performs an important diagnostic function by allowing failed power transistors to be directly identified and replaced. Additionally, the present invention provides the advantage of speeding up the time required to initially set transistors to proper levels. These levels may be set by adjusting the input matching circuit and/or the output matching circuit of each power transistor.

While the invention has been particularly shown and described with reference to a preferred embodiment, it will be understood by those skilled in the art that various changes in form and detail may be made therein without departing from the spirit and scope of the invention.

What is claimed is:

1. Power amplifier circuitry which provides for an output signal of a power transistor used in a power amplifier to be monitored and modified, comprising:
    an input matching circuit which is supplied an RF/microwave carrier signal;
    a power transistor which has an input terminal and an output terminal, wherein the input terminal is connected to the input matching circuit and the power transistor generates a power transistor output signal on the output terminal;
    an output matching circuit connected to the output terminal of the power transistor;
    a coupler, having a first port and a second port, connected to the output matching circuit, which samples the RF/microwave carrier signal and generates a sample signal proportional to the RF/microwave carrier signal on the first port;
    an output load connected to the coupler; and
    a detection circuitry connected to the coupler and housed as a component in a hermetically sealed package, which has a first input signal equal to the signal of the first port of the coupler and a second input signal equal to the signal of the second port of the coupler and which generates a voltage output signal representative of the envelope of the RF/microwave carrier signal, wherein the rise and fall times of the voltage output signal may be modified by tuning the input matching circuit and the output matching circuit, wherein maximum power transfer between the power transistor and the output load may be achieved by tuning the input mathing circuit and the output matching circuit, and wherein power reflected from the input terminal of the power transistor back into the input matching circuit may be minimized by tuning the input matching circuit and the output matching circuit.

2. The circuitry of claim 1, wherein the detection circuitry comprises an attenuator which has a first attenuator terminal connected to the first output port and a second attenuator terminal connected to a detector diode, a RC node connected to the detector diode which comprises a capacitor and a first resistor, and a second resistor connected to the second port of the coupler, wherein the attenuator adjusts the voltage level of the RF/microwave carrier signal to a level suitable for the detector diode, and wherein the detector diode and the capacitor rectify the RF/microwave carrier signal by charging the capacitor to a voltage equal to the voltage output signal minus a voltage drop across the detector diode.

3. The circuitry of claim 2, wherein the detection circuitry is capable of responding to rapid changes in the amplitude of the RF/microwave carrier signal.

4. The circuitry of claim 3, wherein the capacitor has a value equal to approximately 10 pF and the resistor has a value equal to approximately 1K Ohm.

5. The circuitry of claim 2, wherein the second resistor connected to the second port of the coupler is a 50 Ohm resistor used to terminate the second port of the coupler.

6. The circuitry of claim 1, wherein the coupler is a micro-strip coupler.

7. The circuitry of claim 1, wherein the voltage output signal may be monitored using an oscilloscope.

8. The circuitry of claim 1, wherein the voltage output signal may be monitored using built-in-test-equipment (BITE).

9. The circuitry of claim 1, wherein the RF/microwave carrier signal is pulse modulated.

10. The circuitry of claim 1, wherein the output load is a power combiner.

11. A method for monitoring and modifying an output signal of a power transistor used in a power amplifier, comprising the steps of:
    introducing an RF/microwave carrier signal to an input matching circuit connected to an input terminal of a power transistor, wherein the RF/microwave carrier signal propagates through the power transistor and then an output matching circuit connected to an output terminal of the power transistor;
    sampling the RF/microwave carrier signal with a coupler having a first port and a second port and connected to the output matching circuit, wherein the coupler generates a sample signal on the first port proportional to the RF/microwave carrier signal;
    detecting a voltage output signal generated by a detection circuitry, wherein the detection circuitry is housed as a component in a hermetically sealed package, which has a first input signal equal to the signal of the first port of the coupler and a second input signal equal to the signal of the second port of the coupler, and wherein the voltage output signal is representative of the envelope of the RF/microwave carrier signal; and
    modifying the voltage output signal as desired by tuning the input matching circuit and the output matching circuit, wherein maximum power transfer between the power transistor and an output load may be achieved by tuning the input matching circuit and the output matching circuit, and wherein optimum rise and fall times of the power transistor may be achieved by tuning the input matching circuit and the output matching circuit.

12. The method of claim 11, wherein the detection circuitry generates the voltage output signal through the following steps:
    adjusting the voltage level of the RF/microwave carrier signal to a suitable level for a detector diode of the detection circuitry through the use of an attenuator of the detection circuitry, wherein the detection circuitry comprises the attenuator which has a first attenuator terminal connected to the first output port and a second attenuator terminal connected to the detector diode, a RC node connected to the detector diode which comprises a capacitor and a first resistor, and a second resistor connected to the second port of the coupler; and
    rectifying the RF/microwave carrier signal through the detector diode and the capacitor of the detection circuitry by charging the capacitor to a voltage equal to the RF/microwave carrier signal minus a voltage drop across the detector diode.

13. The method of claim 12, wherein in generating the voltage output signal, the detection circuitry is capable of responding to rapid changes in the amplitude of the RF/microwave carrier signal.

14. The method of claim 13, wherein the capacitor has a value equal to approximately 10 pF and the resistor has a value equal to approximately 1K Ohm.

15. The method of claim 12, wherein the second resistor connected to the second port of the coupler is a 50 Ohm resistor used to terminate the second port of the coupler.

16. The method of claim 11, wherein the step of sampling the RF/microwave carrier signal is accomplished with a micro-strip coupler.

17. The method of claim 11, wherein the step of detecting the voltage output signal is accomplished using an oscilloscope.

18. The method of claim 11, wherein the step of detecting the voltage output signal is accomplished using a built-in-test-equipment (BITE).

19. The method of claim 11, wherein modifying the voltage output signal as desired allows maximum power transfer between the power transistor and the output load which is a power combiner.

* * * * *